United States Patent
Sumita

(10) Patent No.: US 7,969,194 B2
(45) Date of Patent: *Jun. 28, 2011

(54) SEMICONDUCTOR DEVICE

(75) Inventor: Masaya Sumita, Nishinomiya (JP)

(73) Assignee: Panasonic Corporation, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/847,732

(22) Filed: Jul. 30, 2010

(65) Prior Publication Data

US 2010/0289527 A1 Nov. 18, 2010

Related U.S. Application Data

(63) Continuation of application No. 11/193,337, filed on Aug. 1, 2005, now Pat. No. 7,782,090.

(30) Foreign Application Priority Data

Aug. 2, 2004 (JP) .................................. 2004-225506

(51) Int. Cl.
*H03K 19/0175* (2006.01)
(52) U.S. Cl. .............. 326/82; 326/83; 326/95; 327/306; 327/534
(58) Field of Classification Search .............. 326/81–83, 326/86–87, 95–98, 30, 26; 327/108–109, 327/333, 530–538, 306, 309, 314, 319, 322
See application file for complete search history.

(56) References Cited

U.S. PATENT DOCUMENTS

| | | | |
|---|---|---|---|
| 4,999,519 A | 3/1991 | Kitsukawa et al. | |
| 5,373,199 A | 12/1994 | Shichinohe et al. | |
| 5,461,338 A | * 10/1995 | Hirayama et al. | ............ 327/534 |
| 5,610,533 A | 3/1997 | Arimoto et al. | |
| 5,818,268 A | 10/1998 | Kim et al. | |
| 5,838,186 A | 11/1998 | Inoue et al. | |
| 5,949,268 A | 9/1999 | Miura et al. | |

(Continued)

FOREIGN PATENT DOCUMENTS

JP 08-335871 12/1996

(Continued)

OTHER PUBLICATIONS

S. Mahapatra and M.A. Alam, "A Predictive Reliability Model for PMOS Bias Temperature Degradation," International Electron Devices Meeting, 2002, IEDM '02, Digest, pp. 505-508.

(Continued)

*Primary Examiner* — James H. Cho
*Assistant Examiner* — Christopher Lo
(74) *Attorney, Agent, or Firm* — McDermott Will & Emery LLP

(57) ABSTRACT

A semiconductor device according to the present invention comprises a first semiconductor integrated circuit 11 having a predetermined function, the first semiconductor integrated circuit outputting a required output signal, a second semiconductor integrated circuit 12 in which a plurality of MOS elements (PMOS transistor or NMOS transistor) for independently switching to and from a conducted state and a nonconducted state in accordance with a plurality of gate signals each having a different timing is provided and the plurality of MOS elements is connected in parallel to an output or an input of the first semiconductor integrated circuit, and a pulse generating circuit 13 for generating and outputting the plurality of gate signals $\phi i$ (i=1, 2, 3) each having a different timing with respect to the plurality of MOS elements in the second semiconductor integrated circuit.

17 Claims, 9 Drawing Sheets

U.S. PATENT DOCUMENTS

| | | | |
|---|---|---|---|
| 6,118,303 | A | 9/2000 | Schmitt et al. |
| 6,232,814 | B1 * | 5/2001 | Douglas, III ................... 327/281 |
| 6,278,283 | B1 | 8/2001 | Tsugai |
| 6,300,800 | B1 | 10/2001 | Schmitt et al. |
| 6,353,346 | B1 * | 3/2002 | Chan ............................ 327/112 |
| 6,466,077 | B1 | 10/2002 | Miyazaki et al. |
| 6,549,040 | B1 | 4/2003 | Alvandpour et al. |
| 6,577,157 | B1 | 6/2003 | Cheung et al. |
| 6,778,002 | B2 * | 8/2004 | Miyazaki et al. ............. 327/534 |
| 6,844,750 | B2 | 1/2005 | Hsu et al. |
| 6,954,103 | B2 | 10/2005 | Yamauchi et al. |
| 6,982,587 | B2 * | 1/2006 | Chen et al. .................... 327/355 |
| 7,049,847 | B2 | 5/2006 | Kitazawa et al. |
| 7,129,770 | B2 | 10/2006 | Barkley et al. |
| 2006/0214695 | A1 | 9/2006 | Lih et al. |

FOREIGN PATENT DOCUMENTS

JP  09-261021  10/1997

OTHER PUBLICATIONS

English version of the Chinese Office Action, issued in Corresponding Chinese Patent Application No. CN 200510089129.5, dated on Aug. 24, 2007.

Japanese Office Action issued in Japanese Patent Application No. JP 2005-221741 dated Aug. 17, 2010.

* cited by examiner

F I G. 1
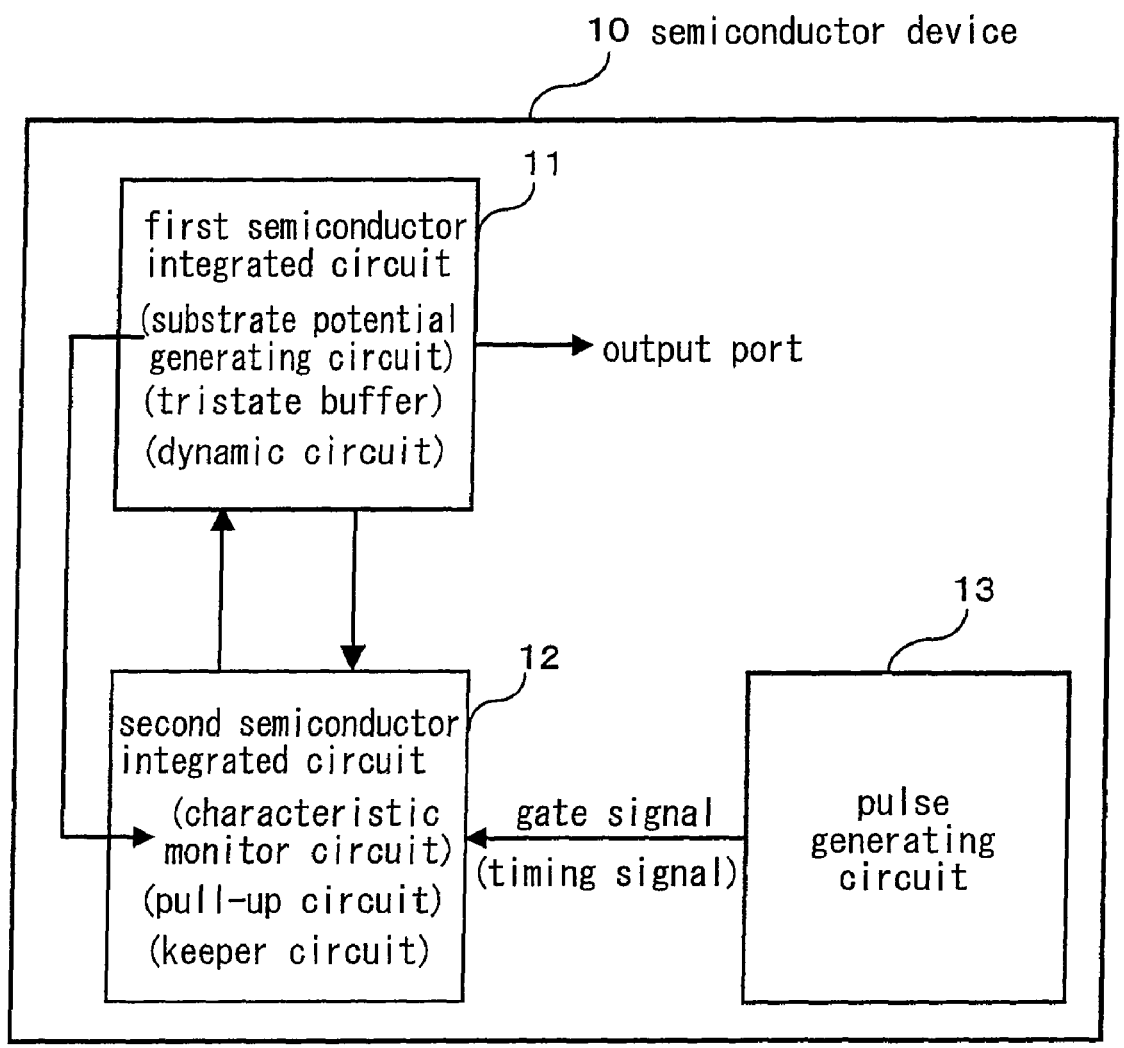

| EN | Q | EN1 | EN2 | IN | OUT |
|----|---|-----|-----|----|-----|
| H  | H | H   | H   | L  | H   |
| L  | H | H   | L   | L  | H   |
| H  | H | H   | H   | H  | L   |
| L  | H | H   | L   | H  | H   |
| H  | L | H   | H   | L  | H   |
| L  | L | L   | H   | L  | H   |
| H  | L | H   | H   | H  | L   |
| L  | L | L   | H   | H  | H   |

SEMICONDUCTOR DEVICE

CROSS-REFERENCE TO RELATED APPLICATIONS

This application is a Continuation of U.S. application Ser. No. 11/193,337, filed on Aug. 1, 2005 now U.S. Pat. No. 7,782,090, claiming priority of Japanese Patent Application No. 2004-225506, filed on Aug. 2, 2004, the entire contents of each of which are hereby incorporated by reference.

FIELD OF THE INVENTION

The present invention relates to a semiconductor device comprising at least two semiconductor integrated circuits having different functions, more particularly to a technology for improving reliability and extending a life. A semiconductor device according to the present invention, when applied to an I/O pad, is very effective as a semiconductor chip for performing a wired data communication with outside, and the semiconductor chip can be extensively used in a chip set. Further, according to the present invention, a semiconductor device in which a substrate control circuit and a dynamic circuit are installed can assure a remarkably long-life reliability.

DESCRIPTION OF THE INVENTION

In a semiconductor integrated circuit, an MOS element (MOS transistor), which is constantly left in a conducted state, can be used as a pull-up resistance. The pull-up means that a potential is stably maintained through connection to the positive side of a power supply via a resistance, and the connected resistance is called the pull-up resistance. The pull-up resistance is often used in an I/O pad circuit for performing a data communication between a semiconductor device and outside, a keeper circuit in a dynamic circuit and the like.

In recent years, a technology for controlling a substrate potential of an MOS transistor to be optimum was proposed in order to optimize a variability generated in delays due to factors such as a process, reduce power consumption and achieve a high-rate operation. In applying the technology, it is necessary to supply the substrate potential in accordance with a characteristic of the MOS transistor such as the variability due to a variability generated in the process. As a proposed method for realizing such, the semiconductor device is divided into a plurality of regions and an ON resistance value of the MOS transistor for monitoring in each region is evaluated so that the generated substrate potential is supplied to the MOS transistor in the corresponding region based on a result of the evaluation, wherein a gate voltage of the MOS transistor for monitoring is fixed to an ON-voltage side.

When the MOS transistor is constantly conducted to be used as the pull-up resistance, a large DC current is consequently generated at all times, which results in deterioration of the characteristic of the MOS transistor. The deterioration is generated in the same manner when the MOS transistor is constantly conducted as a monitoring device for generating the substrate potential.

As a known example of the characteristic deterioration, a saturation current of the MOS transistor is significantly deteriorated due to age-related changes as a result of fixing the gate voltage to the ON-voltage side. More specifically, when a temperature in a chip is increased in a state in which the substrate potential is in a back-bias state relative to the gate, an absolute value of a threshold voltage of the transistor increases through stages. As a result, the transistor is slowed down over time. To be specific, the MOS transistor may deteriorate by approximately 20% due to a characteristic of the saturation current, which possibly leads to the malfunction of the semiconductor integrated circuit after an extended period of time. Such a phenomenon is called NBTI (Negative Bias Temperature Instability). Recently, it was found out that the NBTI is caused by the leak of boron and the like (see "A Predictive Reliability Model for PMOS Bias Temperature Degradation Mahapatra", S. S.† † Alam, M. A.† \ Electron Devices Meeting, 2002. IEDM '02. Digest. International Publication Date:† 2002 On page(s): 505-508).

SUMMARY OF THE INVENTION

Therefore, the present invention has been implemented to solve the issues of the age-related deterioration due to the NBTI, and a main object of the present invention is to provide a semiconductor device whose characteristic is not deteriorated though it is used for a long period of time.

A semiconductor device according to the present invention comprises a first semiconductor integrated circuit having a predetermined function, the first semiconductor integrated circuit outputting a required output signal, and a second semiconductor integrated circuit in which a plurality of MOS elements (PMOS transistor or NMOS transistor) for independently switching to and from a conducted state and a non-conducted state in accordance with a plurality of gate signals each having a different timing is provided and the plurality of MOS elements is connected in parallel to an output or an input of the first semiconductor integrated circuit.

As an alternative constitution, the semiconductor device may further comprise a pulse generating circuit for generating and outputting the plurality of gate signals each having a different timing with respect to the plurality of MOS elements in the second semiconductor integrated circuit.

A pull-up resistance and current monitoring device used for generating the substrate potential, which were conventionally realized by having one MOS element continuously conducted at all times, are realized by having the plurality of MOS elements connected in parallel and dispersively operating them in a time-shifting manner. More specifically, the second semiconductor integrated circuit comprises the plurality of MOS elements, and the plurality of MOS elements connected in parallel is connected to the output or the input of the first semiconductor integrated circuit. When the gate signals are applied to the plurality of MOS elements from the pulse generating circuit or the like, the plurality of MOS elements is separately ON/OFF controlled, and the gate signals are respectively applied to the plurality of MOS elements connected in parallel at the different timings. Thereby, the output signal of the first semiconductor integrated circuit is stabilized without being affected by which of the plurality of MOS elements is in the conducted state at a certain moment. The plurality of MOS elements is dispersively operated in the time-shifting manner so that the NBTI phenomenon in each MOS element due to the lengthy use is alleviated. As a result, a circuit configuration not easily affected by the age-related deterioration can be realized. The circuits to be added in order to prevent the age-related deterioration only demand a small number of MOS elements. Then, the same functions (pull-up resistance, current monitor and the like) can be realized without largely changing the conventional circuit configuration.

In the semiconductor device constituted as above is preferably developed when the first semiconductor integrated circuit is a substrate potential generating circuit and the second semiconductor integrated circuit is a characteristic monitor circuit. Drains of the plurality of MOS elements in the second semiconductor integrated circuit (characteristic monitor circuit) are connected in parallel to the input of the first semiconductor integrated circuit (substrate potential generating circuit) via respective sample hold circuits. Then, the output of the first semiconductor integrated circuit (substrate potential generating circuit) is connected to respective substrates of the plurality of MOS elements in the second semiconductor integrated circuit (characteristic monitor circuit).

Operation states of the plurality of MOS elements, which are characteristic monitoring devices in a plurality of regions into which the semiconductor device is divided, are monitored and a result of the monitoring is fed back to the substrate potential generating circuit so that the substrate potential in accordance with the operation state of each MOS element is generated and outputted. In the foregoing case, a feedback control is affected by the age-related deterioration resulting from the NBTI phenomenon in the MOS element due to the lengthy use. In order to deal with the problem, the plurality of MOS elements is connected to the input of the substrate potential generating circuit via the respective sample hold circuits so that the sampling and hold are time-shifted relative to each other. Then, evaluations of the monitoring using the respective MOS elements can be averaged. As a result, the substrate output of the substrate potential generating circuit is not easily affected by the NBTI phenomenon and accordingly stays at a substantially constant value in accordance with the characteristic of the MOS element.

The foregoing semiconductor integrated circuit is preferably developed as follows in the case in which an I/O pad circuit constitutes the first semiconductor integrated circuit. In the case in which the first semiconductor integrated circuit is a tristate buffer, a pull-up circuit constitutes the second semiconductor integrated circuit. In the case in which the first semiconductor integrated circuit is a dynamic circuit, a keeper circuit constitutes the second semiconductor integrated circuit. In the keeper circuit, the gate signals for the plurality of MOS elements in the second semiconductor integrated circuit are supplied from an NAND circuit whose two inputs are the output signal of the first semiconductor integrated circuit and a timing signal.

In the case in which the pull-up circuit with respect to the output of the tristate buffer comprises the plurality of MOS elements operating independently relative to one another, the output of the tristate buffer can be in such a stable state as not easily affected by the NBTI phenomenon due to the lengthy use. In the case in which the keeper circuit with respect to the output of the dynamic circuit comprises the plurality of MOS elements independently relative to one another, the output of the dynamic circuit can be in such a stable state as not easily affected by the NBTI phenomenon due to the lengthy use.

In the foregoing semiconductor device, the plurality of gate signals preferably has an identical frequency and different phases, and a summed voltage of the gate signals is preferably substantially constant per unit time. Alternatively, the plurality of gate signals preferably has an equal transition probability.

When the summed voltage of the plurality of gate signals is substantially constant per unit time, a pull-up operation can be stabilized though the plurality of MOS elements independently operate at the different timings. Further, when the plurality of gate signals has the equal transition probability, such a pull-up resistance that the plurality of MOS elements is constantly conducted as if they were one MOS element is realized.

Further, a semiconductor device according to the present invention comprises a plurality of MOS elements and a logic circuit for generating a plurality of gate signals inputted to gates of the plurality of MOS elements based on a input signal, the semiconductor device outputting a required output signal, wherein the plurality of MOS elements is equivalent to the output of the required output signal of the semiconductor device, and a value of the required output signal is determined irrespective of values of the other gate signals when any one of the plurality of gate signals is a first logic value.

Further, a semiconductor device according to the present invention comprises a plurality of MOS elements and a plurality of switch elements, wherein the plurality of MOS elements is serially connected, gates of the plurality of MOS elements are commonly connected, substrates of the plurality of MOS elements are commonly connected, an end drain and an end source of the plurality of MOS elements are connected to one sides of the respective switch elements, other sides of the respective switch elements are connected to a semiconductor integrated circuit having a predetermined function, and the connections of the end drain and the end source are switched over in accordance with a control signal for controlling the switch elements.

Further, a semiconductor device according to the present invention comprises a plurality of MOS elements and a plurality of switch elements, wherein the plurality of MOS elements is connected in parallel, gates of the plurality of MOS elements are commonly connected, substrates and sources or drains of the plurality of MOS elements are connected to one sides of the respective switch elements, other sides of the respective switch elements are connected to a semiconductor integrated circuit having a predetermined function, and the connections of the substrates and drains or sources are switched over in accordance with a control signal for controlling the switch elements.

BRIEF DESCRIPTION OF THE DRAWINGS

The present invention is illustrated be way of example and not limitation in the figures of the accompanying drawings, in which like references indicate similar elements and in which:

FIG. 1 is a block diagram illustrating a basic constitution of a semiconductor device according to a preferred embodiment of the present invention;

DETAILED DESCRIPTION OF THE INVENTION

Figure 2:
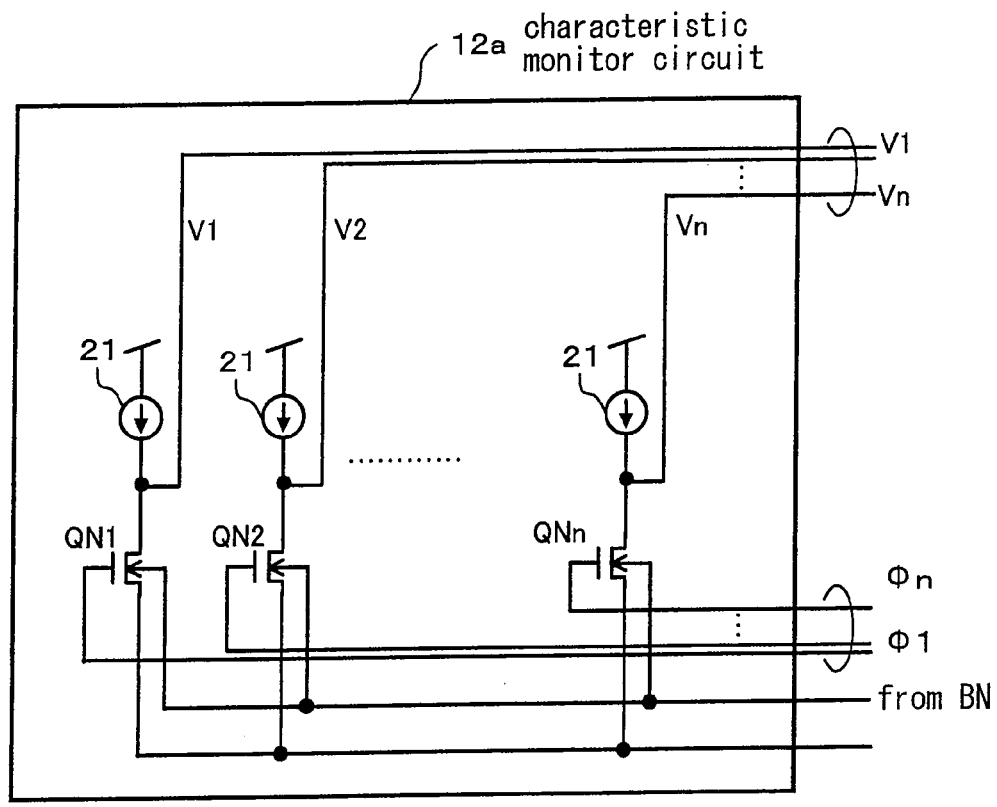
FIG. 2 is a circuit diagram illustrating a constitution of a characteristic monitor circuit according to a first preferred embodiment of the present invention.

Hereinafter, preferred embodiments of the present invention are described referring to the drawings.

An example of a basic constitution according to a preferred embodiment of the present invention is described referring to FIG. 1. FIG. 1 shows a schematic constitution of a semiconductor device 10 commonly employed in first through third embodiments of the present invention described later. The schematic constitution is merely an example and may be modified within the scope of an intended purpose of the present invention.

The semiconductor device 10 comprises a first semiconductor integrated circuit 11, a second semiconductor integrated circuit 12 and a pulse generating circuit 13. An output of the pulse generating circuit 13 is connected to an input of the second semiconductor integrated circuit 12. The first semiconductor integrated circuit 11 and the second semiconductor integrated circuit 12 are bi-directionally connected. However, the first semiconductor integrated circuit 11 and the second semiconductor integrated circuit 12 may be uni-directionally connected, wherein which of the first semiconductor integrated circuit 11 and the second semiconductor integrated circuit 12 serves as a receiving end is different in the respective preferred embodiments. The first semiconductor integrated circuit 11 has an output port for outputting a signal to another semiconductor integrated circuit not shown.

First Preferred Embodiment

Referring to FIGS. 1 through 5, a semiconductor device according to the first preferred embodiment of the present invention is described.

The first preferred embodiment relates to an example of a semiconductor device for supplying an optimum substrate potential to an MOS transistor in the another semiconductor integrated circuit. In the present embodiment, the second semiconductor integrated circuit 12 is a characteristic monitor circuit (current monitor circuit) for monitoring a characteristic of each region of the semiconductor device 10. The first semiconductor integrated circuit 11 is a substrate potential generating circuit for generating a substrate potential in accordance with the characteristic of the MOS transistor monitored by the characteristic monitor circuit.

FIG. 2 is a circuit diagram illustrating a constitution of a characteristic monitor circuit 12a.

The characteristic monitor circuit 12a comprises n number of MOS transistors of an N-channel type QN1, QN2, ..., QNn each having an identical shape and size. Drains of the NMOS transistors QN1, QN2, ..., QNn are connected to equivalent constant power supplies 21. Sources and substrates of the NMOS transistors QN1, QN2, ..., QNn are commonly connected, while gates thereof are connected to a pulse output terminal of a pulse generating circuit 13 so as to input a timing signal φi (i=1, 2, ..., n). The drains of the NMOS transistors QN1, QN2, ..., QNn are connected to an input terminal of a substrate potential generating circuit 11a shown in FIG. 4 via sample hold circuits 14a shown in FIG. 3. The commonly-connected substrates of the NMOS transistors QN1, QN2, ..., QNn are connected to a substrate output port BN of the substrate potential generating circuit 11a.

The n number of NMOS transistors QN1, QN2, ..., QNn correspond to a conventional single NMOS transistor constantly conducted and functions in the same manner.

The NMOS transistors QN1, QN2, ..., QNn are independently switched to and from a conducted state and a non-conducted state in accordance with the timing signal φi (i=1, 2, ..., n) applied to the gates thereof from the pulse generating circuit 13. The NMOS transistors QN1, QN2, ..., QNn further monitor voltage drops (resistance) thereof relative to a constant current supply from a constant current supply 21 and supply a result of the monitoring to the substrate potential generating circuit 11a via the sample hold circuits 14a.

Figure 5:
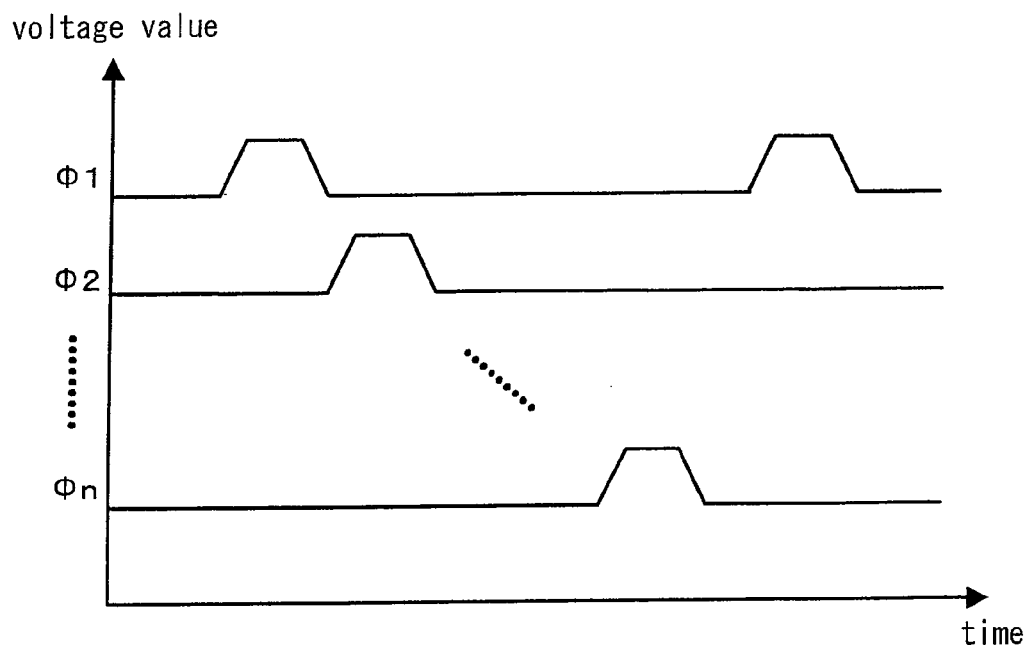
FIG. 5 shows waveforms of timing signals of a pulse generating circuit according to the first preferred embodiment.

The pulse generating circuit 13 comprises n number of pulse output terminals. From the respective pulse output terminals, the timing signal φi (i=1, 2, ..., n) as shown in FIG. 5 is supplied to the gates of the NMOS transistors QN1, QN2, ..., QNn in the characteristic monitor circuit 12a. Because the n number of timing signals φi (i=1, 2, ..., n) are shifted time-wise to one another, the NMOS transistors QN1, QN2, ..., QNn are activated in a time-shifting manner without any duplication.

Outputs of the NMOS transistors QN1, QN2, ..., QNn are respectively connected to the corresponding sample hold circuits 14a in order to stabilize respective inputs to the substrate potential generating circuit 11a. The n number of sample hold circuits 14a collectively constitute a connecting circuit 14. The connecting circuit 14 is a specific component in the present embodiment and not shown in FIG. 1.

Figure 3:
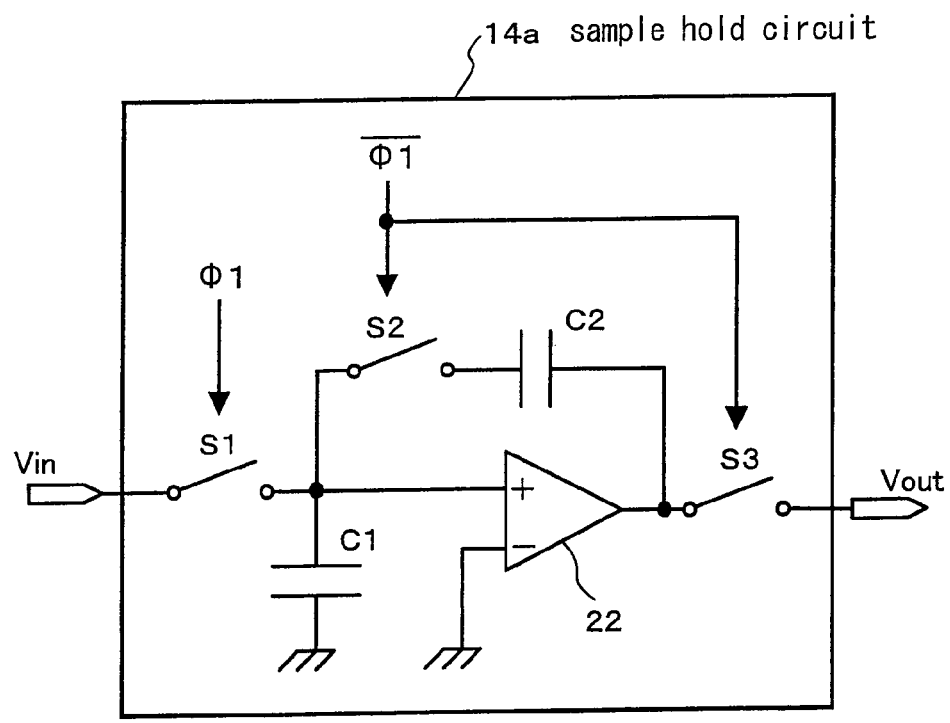
FIG. 3 is a circuit diagram illustrating a constitution of a sample hold circuit according to the first preferred embodiment.

FIG. 3 is a circuit diagram illustrating a constitution of the sample hold circuit 14a. The sample hold circuit 14a is provided so as to correspond to the NMOS transistor QNi (i=1, 2, ..., n) and comprises a sample capacitor C1, a hold capacitor C2, a comparator 22 and switch elements S1, S2 and S3. The corresponding NMOS transistor QNi is conducted by the timing signal φi (i=1, 2, ..., n) transmitted from the pulse generating circuit 13. In the same manner, the switch element S1 is turned on conducted by the timing signal φi, and the switch elements S2 and S3 are turned on by an inversion timing signal/φi thereof. The switch element S1 and the switch elements S2 and S3 are reversely operated.

When the corresponding NMOS transistor QNi is in the conducted state in response to the timing signal φi, the switch element S1 is turned on, while the switch elements S2 and S3 are turned off. The monitoring result from the NMOS transistor QNi is stored in the sample capacitor C1 via the switch element S1. When the information of the sample capacitor C1 transmits through the comparator 22 to be thereby offset-processed, the monitoring result is evaluated. Next, when the timing signal φi is inverted to an "L" level, the NMOS transistor QN1 is non-conducted, and the switch element S1 is turned off, while the switch elements S2 and S3 are turned on. The monitoring result outputted from the comparator 22 is held in the hold capacitor C2 and also transmitted to the input terminal of the substrate potential generating circuit 11a via the switch element S3.

Figure 4:
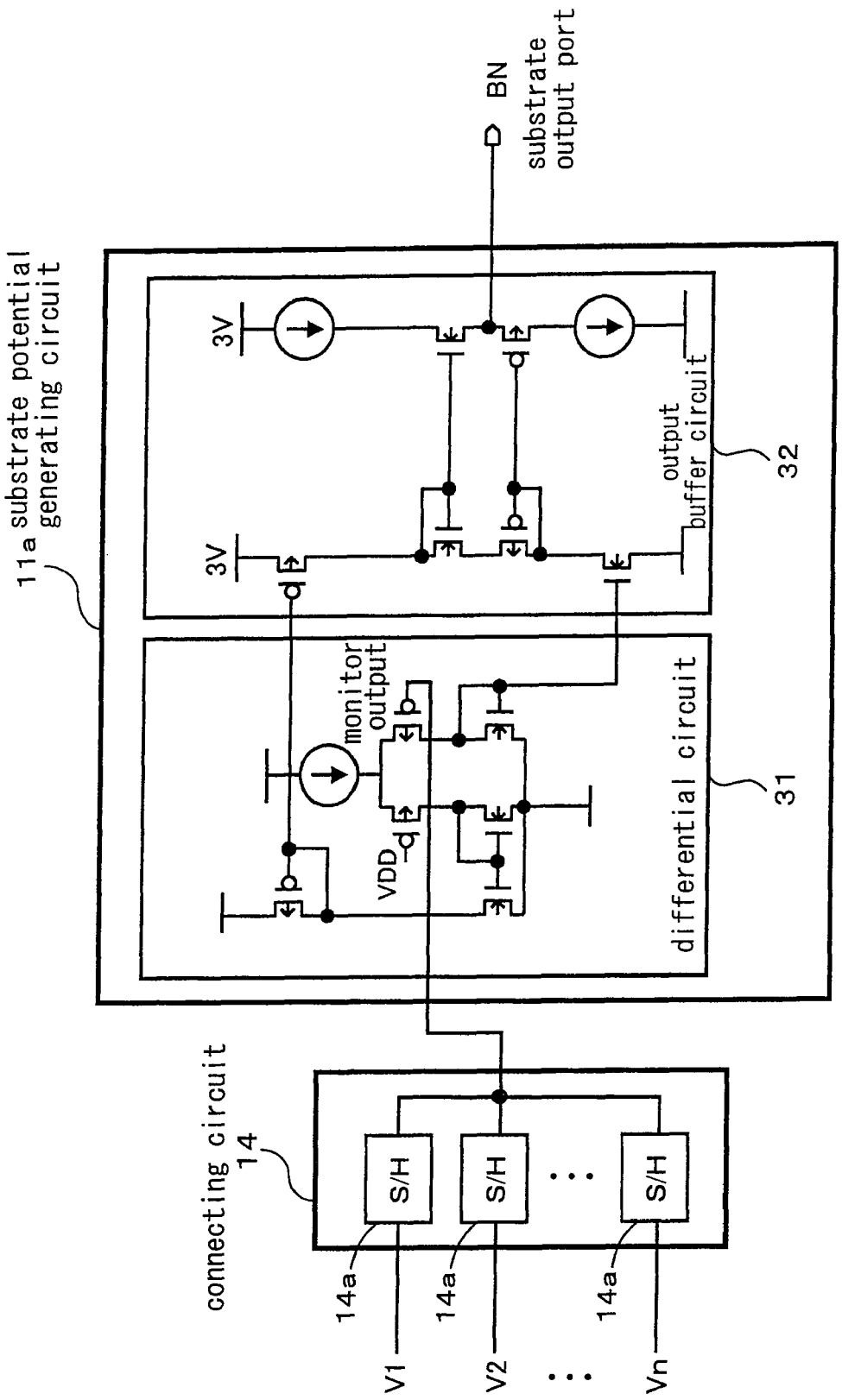
FIG. 4 is a circuit diagram illustrating a constitution of a substrate potential generating circuit according to the first preferred embodiment.

FIG. 4 is a circuit diagram illustrating a constitution of the substrate potential generating circuit 11a as the first semiconductor integrated circuit 11. An output terminal of the connecting circuit 14 is connected to the input terminal of the substrate potential generating circuit 11a. The connecting circuit 14 comprises the n number of sample hold circuits 14a respectively corresponding to the n number of NMOS transistors QN1, QN2, . . . , QNn. Output terminals of the sample hold circuits 14a are commonly connected and connected to the input terminal of the substrate potential generating circuit 11a.

While the first NMOS transistor QN1 is being evaluated, an average output value of the sample hold circuits 14a corresponding to the remaining (n-1) number of NMOS transistors QN2 through QNn is outputted from the connecting circuit 14. In the same manner, while the second NMOS transistor QN2 is being evaluated, an average output value of the sample hold circuits 14a corresponding to the remaining (n-1) number of NMOS transistors QN1 and QN3 through QNn is outputted from the connecting circuit 14. When any of the NMOS transistors is not subjected to the evaluation, an average output value of all of the sample hold circuits 14a is outputted.

The substrate potential generating circuit 11a comprises a differential circuit 31 and an output buffer circuit 32. The output terminal of the connecting circuit 14 is connected to one of input terminals of the differential circuit 31. The differential circuit 31 differential-amplifies the signal inputted via the connecting circuit 14, that is the average output value. The differential-amplified signal is buffered in an output buffer 32 and outputted from the substrate output port BN. The output of the substrate output port BN results in a value in accordance with an average characteristic of the respective NMOS transistors QN1, QN2, . . . , QNn in the characteristic monitor circuit 12a. In other words, the output of the substrate output port BN results in an optimum value in accordance with the characteristics of the NMOS transistors. A supply substrate voltage outputted from the substrate output port BN is outputted to substrates of a plurality of MOS transistors not shown and also commonly supplied to the substrates of the n number of NMOS transistors QN1, QN2, . . . , QNn in the characteristic monitor circuit 12a.

The n number of NMOS transistors QN1, QN2, . . . , QNn in the characteristic monitor circuit 12a are independently and individually evaluated dispersively in the time-shifting manner. However, the monitoring result thereof is averaged when it is reflected on the generation of the substrate potential.

As described, when the n number of NMOS transistors QN1, QN2, . . . , QNn in the characteristic monitor circuit 12a are dispersively operated in the time-shifting manner, the NBTI phenomenon generated in the NMOS transistors QN1, QN2, . . . , QNn as a result of the lengthy use is alleviated, and a circuit configuration not easily affected by the age-related deterioration can be realized.

In the foregoing description, one of the NMOS transistor is conducted and evaluated at an optional time point, however, at least two NMOS transistors may be simultaneously conducted and evaluated in the respective periods. Importantly, the substrate potential in accordance with the operation state of the semiconductor device can be substantially constantly outputted from the substrate output port BN of the substrate potential generating circuit 11a irrespective of which of the NMOS transistors QN1, QN2, . . . , QNn is in the conducted state in a certain period. To put it differently, the n number of NMOS transistors QN1, QN2, . . . , QNn connected in parallel in the characteristic monitor circuit 12a are dispersively operated in the time-shifting manner so as to avoid any influence on the output of the substrate potential generating circuit 11a.

Further, in the foregoing description, the switch element S3 is turned on in the sample hold circuit 14a when the data is held. However, the switch element S3 may not be necessarily turned on at the time of holding the data as long as it is turned off when the NMOS transistor is evaluated. Because the average output value of the plurality of sample hold circuits 14a is inputted to the substrate potential generating circuit 11a, the number of the sample hold circuits 14a for outputting the values is irrelevant as long as the respective sample hold circuits 14a output the values which are correctly evaluated.

Further, in the foregoing description, the timing signal $\phi i$ (i=1, 2, . . . , n) is separately applied to the gates of the respective NMOS transistors to realize the switchover of the n number of NMOS transistors QN1, Qn2, . . . , QNn to and from the conducted state and the non-conducted state. Alternatively, for example, the switch elements may be inserted between the sources of the respective NMOS transistors and the current supplies, wherein the respective switch elements are individually controlled so as to switch to and from the conducted state and the non-conducted state.

The present embodiment described the substrate potential generating circuit for generating the substrate potential of the NMOS transistor. However, the ordinarily skilled in the art can easily modify the constitution according to the present embodiment in such manner that the substrate potential generating circuit generates a substrate potential of a PMOS transistor.

Second Preferred Embodiment

Figure 6:
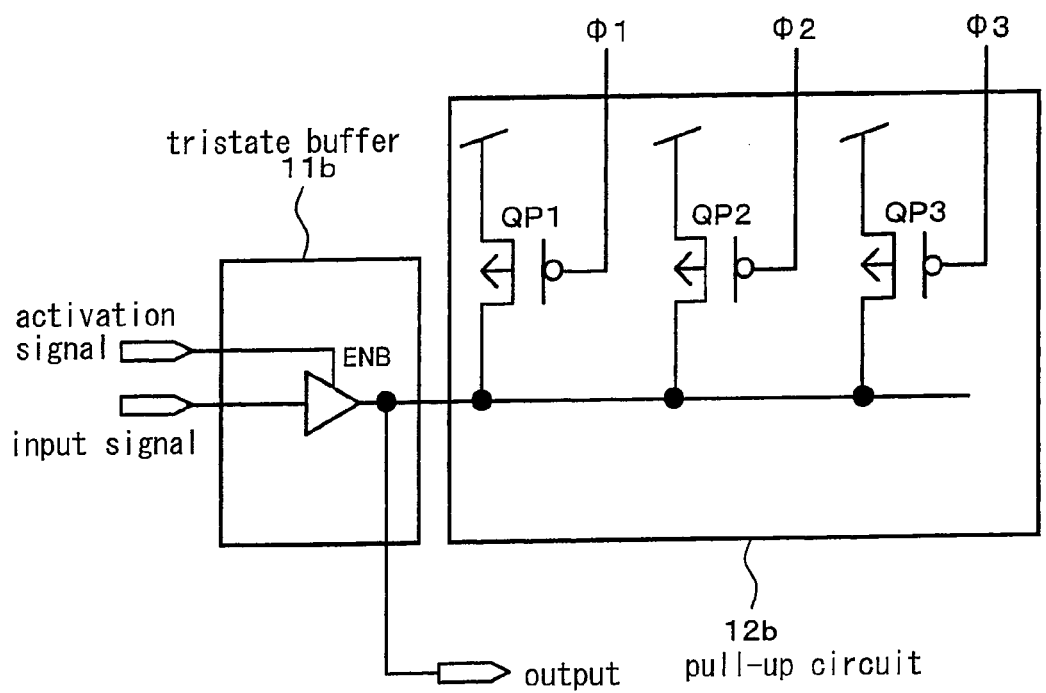
FIG. 6 shows circuit diagrams illustrating constitutions of a tristate buffer and a pull-up circuit according to a second preferred embodiment of the present invention.
Figure 7:
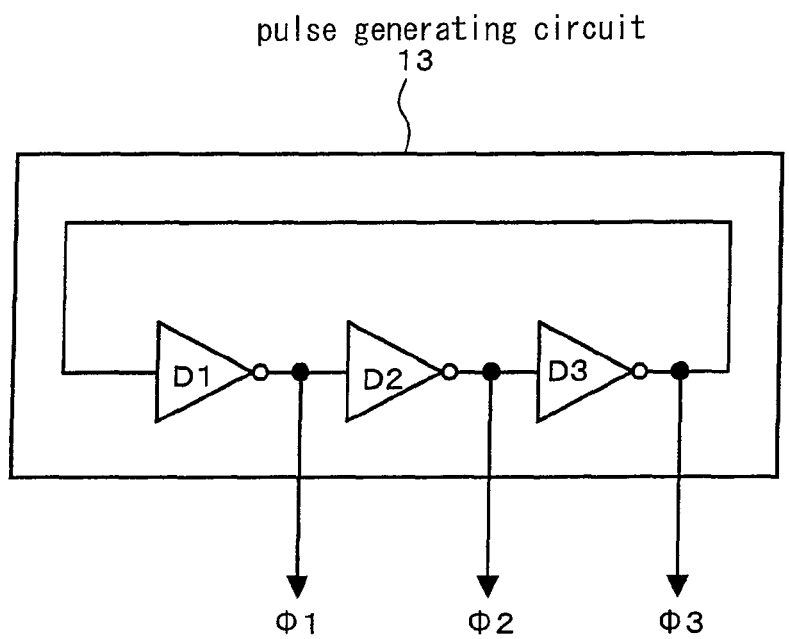
FIG. 7 is a circuit diagram illustrating a constitution of a pulse generating circuit according to the second preferred embodiment.
Figure 8:
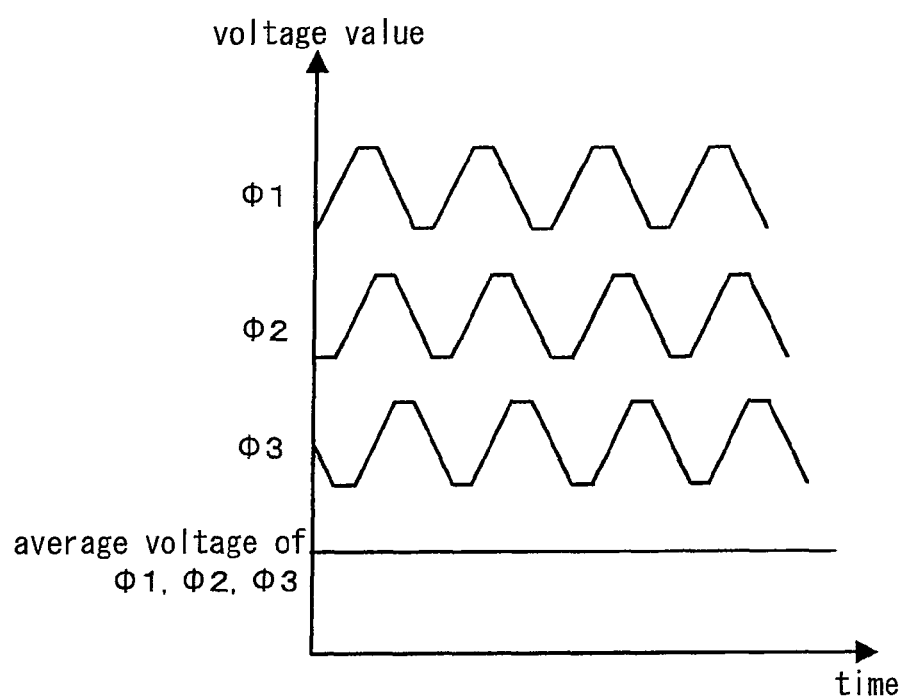
FIG. 8 shows waveforms of timing signals of the pulse generating circuit according to the second preferred embodiment.

Referring to FIGS. 6 through 8, a semiconductor device according to the second preferred embodiment of the present invention is described.

The second preferred embodiment relates to an example of an I/O pad circuit. In the present embodiment, the first semiconductor integrated circuit 11 is a tristate buffer, and the second semiconductor integrated circuit 12 is a pull-up circuit.

FIG. 6 shows circuit diagrams illustrating constitutions of a tristate buffer 11b and a pull-up circuit 12b. The tristate buffer 11b buffers an input signal using an activation signal and outputs the buffered signal. The pull-up circuit 12b serves to prevent a high impedance output from being destabilized when the tristate buffer 11b is inactivated. The pull-up circuit 12b comprises three PMOS transistors QP1, QP2 and QP3. Sources of the PMOS transistors QP1, QP2 and QP3 are connected to power-supply terminals, while drains thereof are commonly connected to an output terminal of the tristate buffer 11b. Timing signals $\phi 1$, $\phi 2$ and $\phi 3$ from a pulse generating circuit 13 are individually applied to gates of the PMOS transistors QP1, QP2 and QP3.

The three PMOS transistors QP1, QP2 and QP3 correspond to the conventional single PMOS transistor in the conducted state.

FIG. 7 is a circuit diagram illustrating a constitution of the pulse generating circuit 13. The pulse generating circuit 13 comprises three delay elements D1, D2 and D3 and constitutes a ring oscillator in which an output terminal of the delay element D1 is connected to an input terminal of the delay element D2, an output terminal of the delay element D2 is connected to an input terminal of the delay element D3, and an output terminal of the delay element D3 is connected to an input terminal of the delay element D1. The timing signals $\phi 1$, $\phi 2$ and $\phi 3$ respectively outputted from the delay elements D1, D2 and D3 are input signals to the gates of the PMOS transistors QP1, QP2 and QP3 in the pull-up circuit 12b.

FIG. 8 shows waveforms of the timing signals $\phi 1$, $\phi 2$ and $\phi 3$ and an average voltage value of the timing signals $\phi 1$, $\phi 2$ and $\phi 3$. The waveforms of the timing signals $\phi 1$, $\phi 2$ and $\phi 3$ have an identical frequency and different phases. The average voltage value of the three timing signals φ1, φ2 and φ3 is constant per unit time. Transition probabilities of the PMOS transistors QP1, QP2 and QP3 whose respective gates input the timing signals φ1, φ2 and φ3 are equal to one another, and such a pull-up resistance that as if a single PMOS transistor were constantly in the conducted state is realized.

A summed pull-up current capacity of the three PMOS transistors QP1, QP2 and QP3 can be substantially equal to a pull-up current capacity of the single PMOS transistor constantly conducted. Therefore, the pull-up can be realized in the same manner as in the conventional technology, while the age-related deterioration resulting from the NBTI phenomenon due to the lengthy use is reduced to approximately ⅓ in comparison to the conventional technology. Accordingly, an extended life can be reliably assured in the I/O pad circuit in which the pull-up resistance is important.

In the foregoing description, the three PMOS transistors are provided, however, the present embodiment is not limited thereto. Further, the NMOS transistor may be used in place of the PMOS transistor. Further, the pulse generating circuit 13 may not necessarily be constituted in such manner that the plurality of delay elements is connected in the ring shape. Importantly, the function obtained in the constantly-conducted single transistor is realized by dispersively operating the plurality of MOS transistors in the time-shifting manner. In other words, the plurality of MOS transistors is dispersively operated in the time-shifting manner so as to avoid any influence on the output of the tristate buffer 11b.

Further, in the foregoing description, the timing signal φ1 (i=1, 2, 3) is separately applied to the gates of the respective PMOS transistors to realize the switchover of the three PMOS transistors QP1, QP2 and QP3 to and from the conducted state and the non-conducted state. Alternatively, for example, the switch elements may be inserted between the sources of the respective PMOS transistors and the current supplies, wherein the respective switch elements are individually controlled so as to switch to and from the conducted state and the non-conducted state.

Third Preferred Embodiment

Referring to FIGS. 1 through 9, a semiconductor device according to the third preferred embodiment is described.

The third preferred embodiment relates to an example of a dynamic circuit. In the present embodiment, a dynamic circuit constitutes the first semiconductor integrated circuit 11, and a keeper circuit constitutes the second semiconductor integrated circuit 12.

Figure 9:
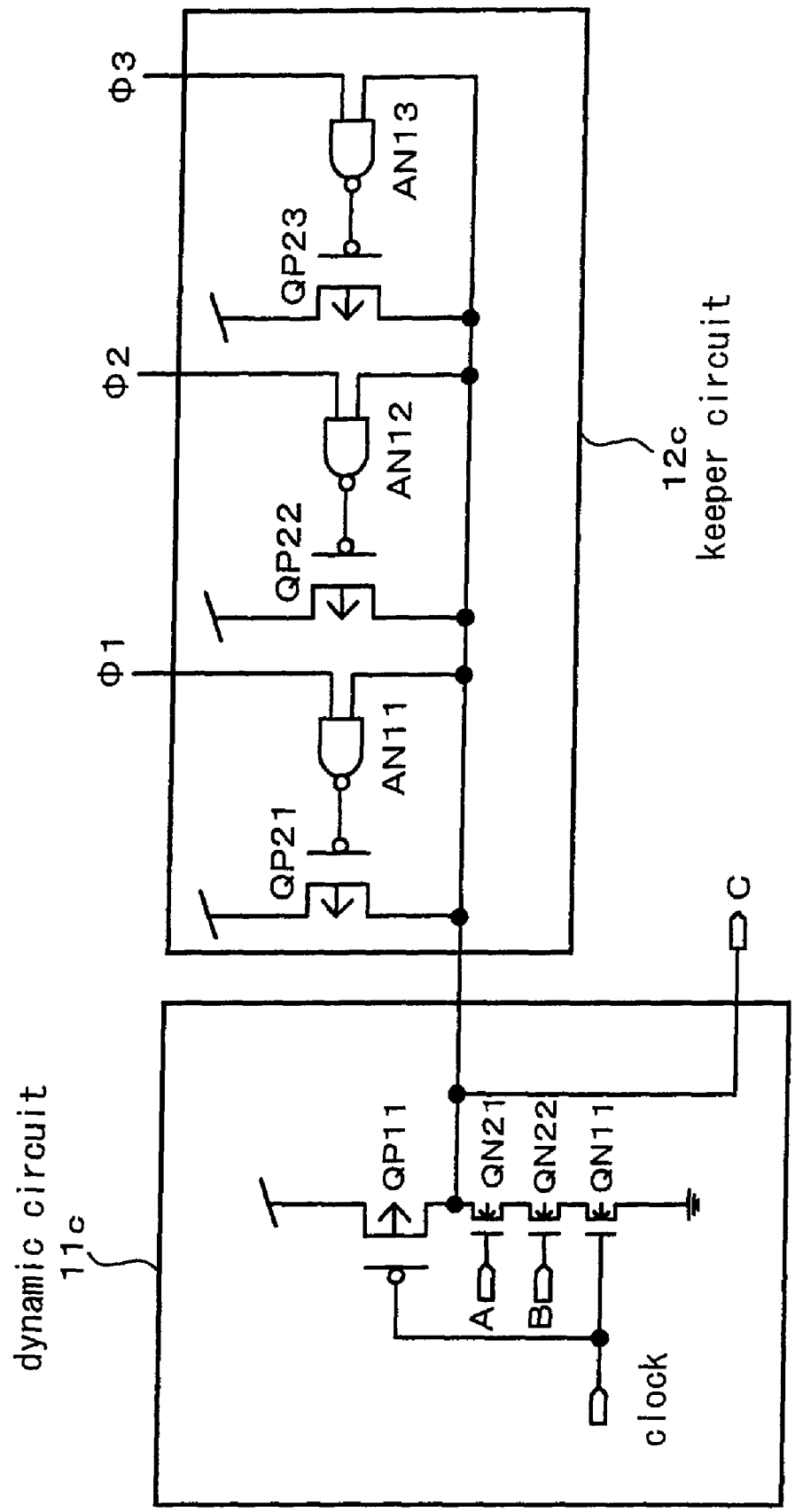
FIG. 9 shows circuit diagrams illustrating constitutions of a dynamic circuit and a keeper circuit according to a third preferred embodiment of the present invention.

FIG. 9 shows circuit diagrams illustrating constitutions of a dynamic circuit 11c and a keeper circuit 12c. In the dynamic circuit 11c, a PMOS transistor QP11 and an NMOS transistor QN 11 activated by a clock signal and NMOS transistors QN21 and QN22 switched at a high speed in response to the application of input signals A and B to gates thereof are serially connected. An output signal C corresponding to the input signals A and B is outputted from a drain connecting point of the PMOS transistor QP11 and the NMOS transistor QN21. The keeper circuit 12c is provided in order to deal with a floating state of the output in the dynamic circuit 11c.

The keeper circuit 12c comprises three PMOS transistors QP21, QP22 and QP23, and three NAND circuits AN11, AN12 and AN13. Sources of the PMOS transistors QP21, QP22 and QP23 are connected to power-supply terminals, while drains thereof are connected to an output of the dynamic circuit 11c. Gates of the PMOS transistors QP21, QP22 and QP23 are connected to outputs of the corresponding NAND circuits AN11, AN12 and AN13. One inputs of the NAND circuits AN11, AN12 and AN13 are connected to the output of the dynamic circuit 11c, while another inputs thereof are connected to outputs of timing signals Ø1, Ø2 and Ø3 of a pulse generating circuit 13. A constitution of the pulse generating circuit 13 is the same as in the example of the second preferred embodiment (FIG. 7), and not described here again. Waveforms of the timing signals Ø1, Ø2 and Ø3 are also the same as in the example of the second preferred embodiment (FIG. 8), and not described here again. The NAND circuits AN11, AN12 and AN13 serve as inverters.

A summed pull-up current capacity of the three PMOS transistors QP21, QP22 and QP23 can be arranged to be substantially equal to the pull-up current capacity of the single PMOS transistor constantly conducted. Therefore, the pull-up can be realized in the same manner as in the conventional technology, and the age-related deterioration resulting from the NBTI phenomenon due to the lengthy use can be reduced approximately ⅓ in comparison to the conventional technology. As a result, a reliable long life can be assured in the keeper circuit corresponding to the dynamic circuit in which the pull-up resistance is important.

In the foregoing description, the three PMOS transistors are provided, however, the present embodiment is not limited thereto. Further, the NMOS transistor may be provided in place of the PMOS transistor. Importantly, the same function as in the single transistor constantly conducted is realized by dispersively operating the plurality of MOS transistors in the time-shifting manner. In other words, the plurality of MOS transistors can be dispersively operated in the time-shifting manner so that the output of the dynamic circuit 11c is not thereby affected.

Further, in the foregoing description, the timing signal φi (i=1, 2, 3) is separately applied to the NAND circuits NA11, NA12 and NA13 connected to the gates of respective PMOS transistors to realize the switchover of the three PMOS transistors QP21, QP22 and QP23 to and from the conducted state and the non-conducted state. Alternatively, for example, the switch elements may be inserted between the sources of the respective NMOS transistors and the current supplies, wherein the respective switch elements are individually controlled so as to switch to and from the conducted state and the non-conducted state.

The present embodiment can be easily applied to a keeper circuit of a domino circuit and the like.

Fourth Preferred Embodiment

Referring to FIGS. 10 through 13, a semiconductor device according to a fourth embodiment of the present invention is described.

In the fourth preferred embodiment, instead of inputting the plurality of gate signals having the equal transition probability to the gates of the MOS elements in the time-shifting manner as described in the first through third preferred embodiments, a signal is logically formed using a CMOS logic circuit, a load of the NBTI applied to one MOS element is dispersed into a plurality of MOS elements.

Figure 10:
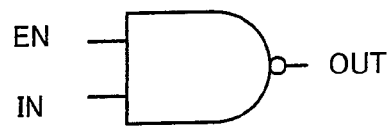
FIG. 10 is an equivalence logic diagram according to a fourth preferred embodiment of the present invention.

FIG. 10 shows a two-input NAND circuit. The two-input NAND circuit outputs an inversion signal of a signal IN as a signal OUT when a signal EN is "H", while outputting "H" as the signal OUT irrespective of a value of the signal IN when the signal EN is "L". The two-input NAND circuit constituted as described is used, for example, for clock gating. To describe the clock gating, if a clock is supplied or not supplied is controlled depending on if a circuit as an gating object is activated or non-activated. When the object circuit is activated in a short period and non-activated in a long period in the clock gating, a gate of a PMOS transistor in the two-input NAND circuit is on an ON-voltage side in an extended period and largely affected by the NBTI. In the present embodiment, the age-related deterioration due to the NBTI in the PMOS transistor in the foregoing case is alleviated. It is needless to say that the present embodiment is applicable irrespective of the NAND circuit and clock gating.

Figure 11:
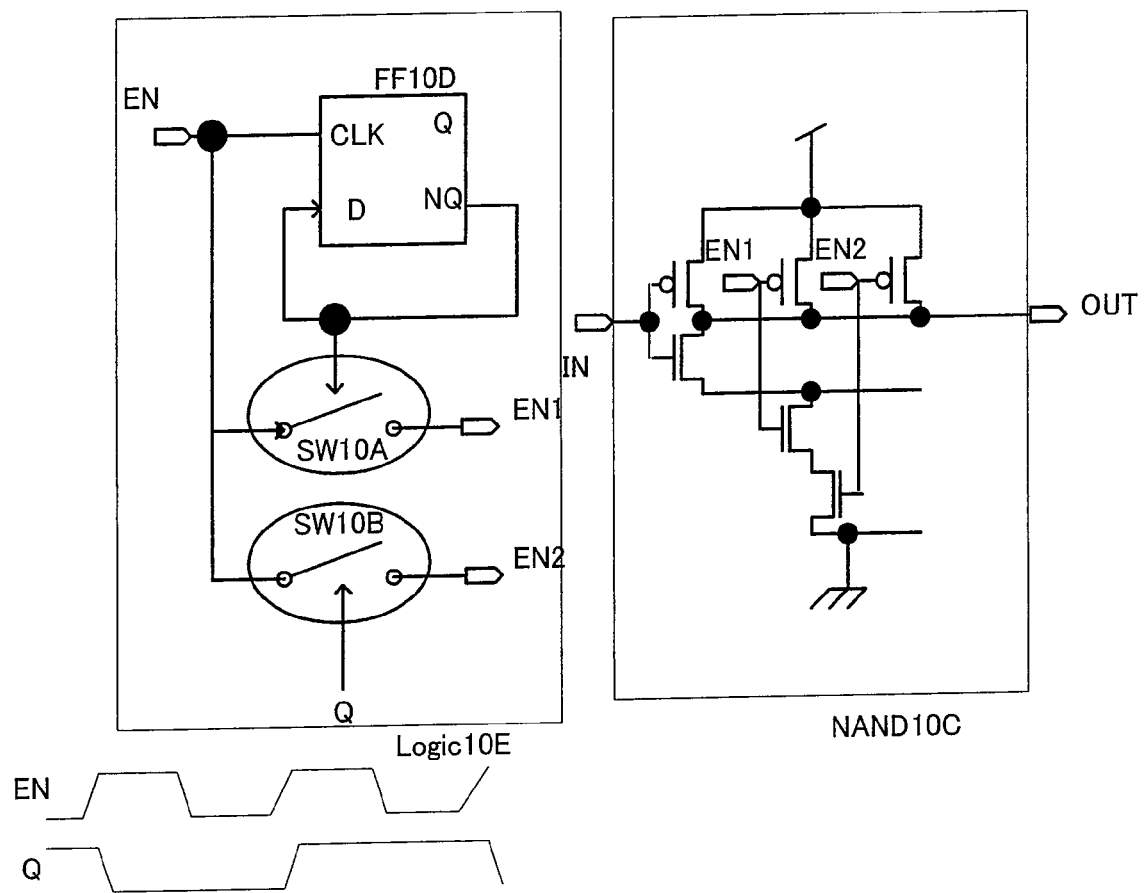
FIG. 11 shows circuit diagrams illustrating a constitution of a two-input NAND circuit and an enable signal generation logic according to the fourth preferred embodiment.

FIG. 11 shows a specific circuit diagram of the two-input NAND circuit according to the present embodiment, which is logically equivalent to the NAND circuit shown in FIG. 10. The two-input NAND circuit according to the present embodiment comprises a Logic 10E for internally generating an EN1 signal and an EN2 signal based on the EN signal and a NAND 10C for inputting the EN1 signal and the EN2 signal generated in addition to the IN signal and outputting a NAND logic signal of the IN signal and the EN signal. In the Logic 10E, the EN signal is inputted to a clock CLK of a flip-flop 10D, and an inversion output NQ of the flip-flop 10D is inputted to data D of the flip-flop 10D. A switch SW10B controlled by an output Q of the flip-flop 10D communicates the signal EN to the EN2 when the Q is "H". A switch SW10A controlled by an NQ of the flip-flop 10D communicates the signal EN to the EN1 when the NQ is "H". More specifically, every time when the EN is "H", a value of the input signal EN is communicated alternately to the EN1 and EN2.

Figures 12, 13:
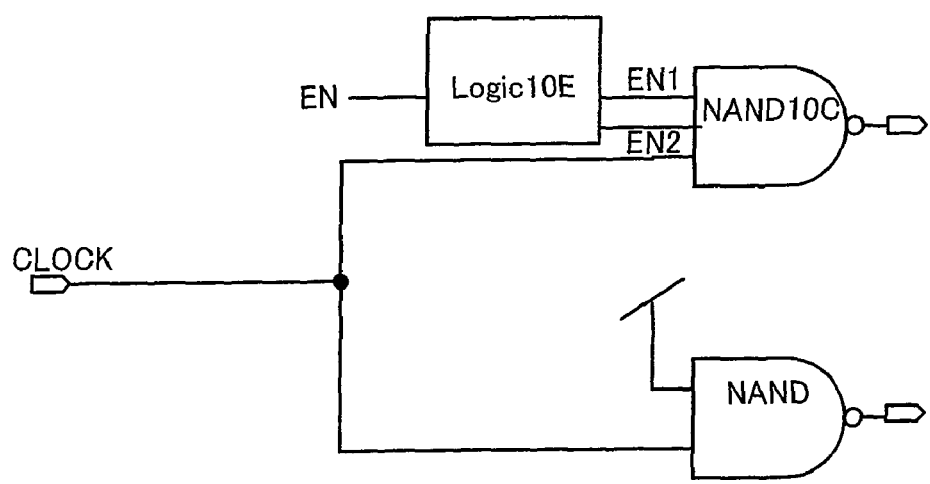
FIG. 12 is a truth value chart according to the fourth preferred embodiment.
FIG. 13 is a circuit diagram illustrating an example of application to a clock tree according to the fourth preferred embodiment.

FIG. 12 shows an example of truth value list of the signals EN, Q, EN1, EN2, IN and OUT. As shown in FIG. 12, when the signal EN is "L", the signal L is communicated to one of the EN1 and EN2. In the NAND 10c, when one of the EN1 and EN2 is "L", one of the two PMOS transistors disposed in parallel, in which the EN1 and EN2 are inputted to the gates, is conducted, while one of two NMOS transistors serially disposed, in which the EN1 and EN2 are inputted to the gates, is non-conducted. More specifically, the OUT results in "H" irrespective of the value of the IN, and the two-input NAND circuit according to the present embodiment is logically equivalent to the two-input NAND circuit shown in FIG. 10. Further, as long as the gate of one of the PMOS transistors inputting the EN1 and EN2 to the gates thereof is "L", the conducted state is obtained. As a result, the deterioration due to the NBTI is dispersed into the two PMOS transistors.

FIG. 13 shows an example in which the two-input NAND circuit according to the present embodiment is applied to the clock gating. The two-input NAND circuit comprising the Logic 10E and the NAND 10C outputs the inversion signal of the clock when the EN signal is "H", while fixing the clock to "H" when the EN signal is "L". In other words, when the circuit as a destination of the clock supply is non-activated, the EN is fixed to "L". In the NAND shown in the lower part of the drawing, one of the inputs thereof is fixed to "H", meaning that the inversion signal of the clock is constantly supplied to the circuit. The deterioration due to the NBTI is intensified when the gate of the PMOS transistor is fixed to "L". According to the constitution of the present embodiment, the deterioration of the NAND 10C is lessened. As a result, an increase of a clock skew in response to the clock output not subjected to the gating due to the age-related deterioration can be reduced.

Fifth Preferred Embodiment

Figure 14:
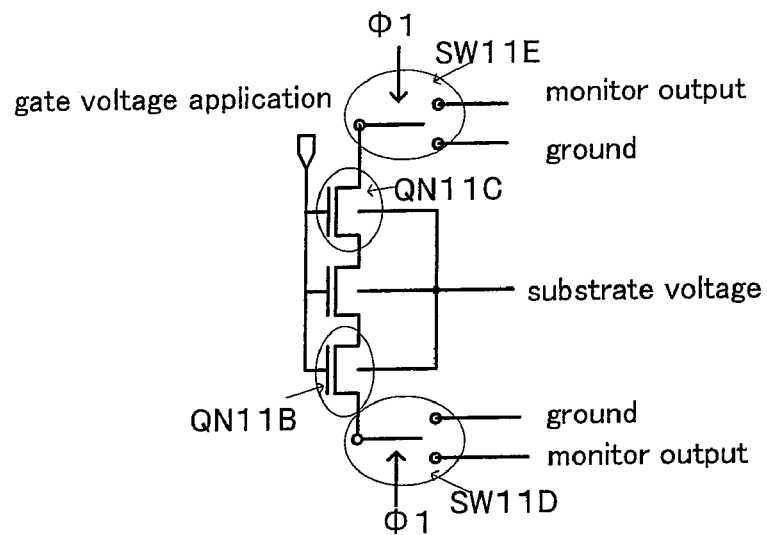
FIG. 14 shows a monitor circuit according to a fifth preferred embodiment of the present invention.

Referring to FIG. 14, a semiconductor device according to a fifth preferred embodiment of the present invention is described.

FIG. 14 shows a characteristic monitor circuit in which the characteristic monitor circuit 12a of FIG. 2 connected to the substrate potential generating circuit 11a of FIG. 4 is differently constituted. In FIG. 14, three NMOS transistors supplied with a common substrate voltage and gate voltage are serially connected. The common gate voltage is set to an optional voltage. The substrate voltage equals to the voltage value from the substrate output port of the substrate potential generating circuit 11a.

A drain of an NMOS transistor QN11C is connected to a switch element SW11E, and if the drain is connected to a monitor output of a differential circuit 31 via a connecting circuit 14 or connected to a ground potential is selected in accordance with a control signal φ1. To put differently, the drain is connected to a monitor output V1 when the φ1 is "H", while being connected to the ground potential when the φ1 is "L". A source of an MOS transistor QN11B is connected to a switch element SW11D, and if the source is connected to the monitor output of the differential circuit 31 via the connecting circuit 14 or connected to the ground potential is selected in accordance with the control signal φ1. To put it differently, the source is connected to the ground potential when the φ1 is "H", while being connected to the monitor output V1 when the φ1 is "L". Thus, the MOS transistor QN11C and the MOS transistor QN11B are alternately connected to the ground potential and the monitor output V1 in a switching manner.

As described, when the MOS transistor to be connected to the monitor output is switched in response to the φ1, a voltage to be applied to a gate-source voltage Vgs of the MOS transistor QN11B is changed, thereby alleviating any influence from the NBTI. In the present embodiment, it is unnecessary to provide the n number of MOS transistors and the n number of sample hold circuits. The age-related deterioration can be reduced by providing only the group of MOS transistors serially connected.

Further, when a drain-source voltage Vds of the MOS transistor QN11C is a value approximate to a threshold value when the φ1 is "H", while being as approximate as possible to zero when the φ1 is "L". In general, the age-related deterioration in the MOS transistor is caused by a generally-called hot carrier effect other than the NBT1 already described. The hot carrier effect results from the drain-source voltage Vds, and the deterioration is worsened as the Vds is increased. More specifically, the deterioration due to the hot carrier effect is reduced because the MOS transistor QN11C is changed as a result of controlling which of the MOS transistors is connected to the monitor output using the φ1.

Sixth Preferred Embodiment

Figure 15:
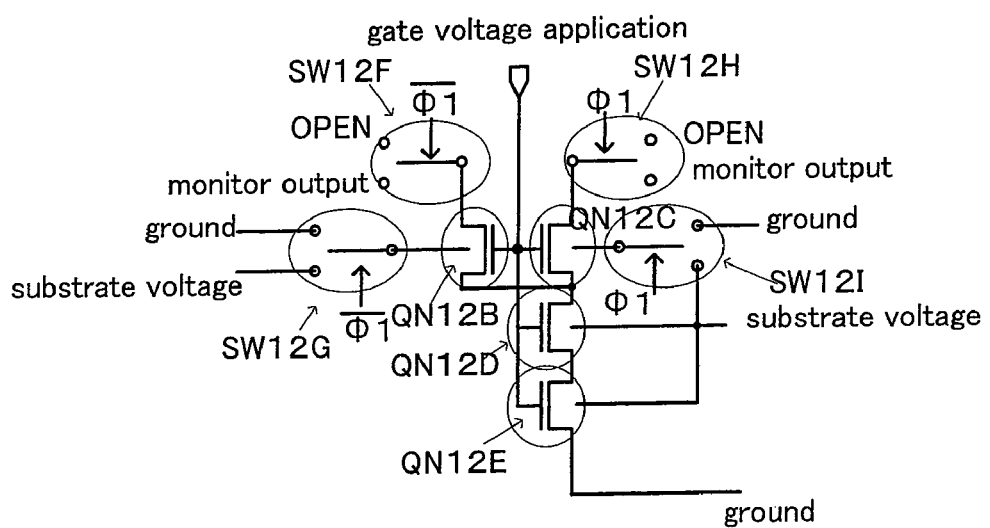
FIG. 15 shows a monitor circuit according to a sixth preferred embodiment of the present invention.

Referring to FIG. 15, a semiconductor device according to a sixth preferred embodiment of the present invention is described.

FIG. 15 shows a characteristic monitor circuit in which the characteristic monitor circuit 12a of FIG. 2 connected to the substrate potential generating circuit 11a of FIG. 4 is differently constituted. In the present embodiment, NMOS transistors QN12B and QN12C are connected in parallel, and NMOS transistors QN12B, QN12C, QN12D and QN12E are serially connected in three stages. Gates of the respective MOS transistors are commonly connected and set to an optional voltage. Substrates of the MOS transistors QN12D and QN12E are commonly connected, to which the same voltage as the voltage value from the substrate output port of the substrate potential generating circuit 11a is applied.

A drain of the MOS transistor QN12B is connected to a switch element SW12F, and if the drain is connected to a monitor output of a differential circuit 31 or opened is selected in accordance with a control signal φ1. In other words, the drain is connected to a monitor output V1 when the φ1 is "H", while being opened when the φ1 is "L". A drain of the MOS transistor QN12C is connected to a switch element SW12H, and if the drain is connected to the monitor output of the differential circuit 31 or opened is selected in accordance with the control signal φ1. In other words, the drain is connected to the monitor output V1 when the φ1 is "L", while being opened when the φ1 is "H". Thus, the MOS transistor QN12C and the MOS transistor QN12B are alternately connected to the ground potential and the monitor output V1 in the switching manner.

As described, when the MOS transistor to be connected to the monitor output is switched in response to the φ1, any influence from the NBTI can be alleviated. In the present embodiment, it is unnecessary to provide the n number of MOS transistors and the n number of sample hold circuits. The age-related deterioration can be reduced by providing only one MOS transistor shown in FIG. 15.

A substrate of the MOS transistor QN12B is connected to a switch element SW12G, and if the substrate is connected to the substrate output port BN of the substrate potential generating circuit 11a or connected to the ground potential is selected in accordance with a control signal/φ1. In other words, the substrate is connected to the substrate voltage when the φ1 is "H", while being grounded when the φ1 is "L". A substrate of the MOS transistor QN12C is connected to a switch element SW12I, and if the substrate is connected to the substrate output port BN of the substrate potential generating circuit 11a or connected to the ground potential is selected in accordance with the control signal φ1. In other words, the substrate is connected to the substrate voltage when the φ1 is "L", while being grounded when the φ1 is "H".

The influence from the hot carrier effect also results from the substrate voltage, and the deterioration is worsened as the substrate voltage is smaller (back bias). More specifically, the deterioration due to the hot carrier effect is alleviated because the substrate potential of the MOS transistor QN11C is changed in response to the φ1.

While the invention has been described an illustrated in detail, it is to be clearly understood that this is intended be way of illustration and example only and is not to be taken by way of limitation, the spirit and scope of this invention being limited only be the terms of the following claims.

The invention claimed is:

1. A semiconductor device comprising:
a first semiconductor integrated circuit having a predetermined function, the first semiconductor integrated circuit outputting a required output signal; and
a second semiconductor integrated circuit in which a plurality of MOS elements each of which is independently controllable to and from a conducting state and a non-conducting state in accordance with a plurality of gate signals are provided, the plurality of MOS elements is connected in parallel, and outputs of the plurality of MOS elements are coupled to an output or an input of the first semiconductor integrated circuit, wherein:
each of said plurality of MOS elements is capable of generating an output signal which is independent of the output signal of the other MOS elements, and
the plurality of MOS elements are controlled so that:
at least one of the plurality of MOS elements is in conducting state during an operation of the second semiconductor integrated circuit,
there is no situation in which all of the plurality of MOS elements are simultaneously in non-conducting state, and
a resistance value of the plurality of MOS elements becomes substantially constant regardless of values of the plurality of gate signals.

2. The semiconductor device as claimed in claim 1, further comprising a pulse generating a circuit for generating and outputting the plurality of gate signals for the plurality of MOS elements in the second semiconductor integrated circuit.

3. The semiconductor device as claimed in claim 1, wherein:
drains of the plurality of MOS elements in the second semiconductor integrated circuit are connected in parallel to the input of the first semiconductor integrated circuit,
the output of the first semiconductor integrated circuit is connected to respective substrates of the plurality of MOS elements, and
the first circuit is configured to output the output based on at least one of the inputs from the plurality of MOS elements in the second semiconductor integrated circuit.

4. The semiconductor device as claimed in claim 3, wherein
a characteristic monitor circuit constitutes the second semiconductor integrated circuit.

5. The semiconductor device as claimed in claim 1, wherein
an I/O pad circuit constitutes the first semiconductor integrated circuit.

6. The semiconductor device as claimed in claim 1, wherein
a pull-up circuit constitutes the second semiconductor integrated circuit.

7. The semiconductor device as claimed in claim 6, wherein
a tristate buffer constitutes the first semiconductor integrated circuit.

8. The semiconductor device as claimed in claim 1, wherein
a keeper circuit constitutes the second semiconductor integrated circuit.

9. The semiconductor device as claimed in claim 8, wherein
a dynamic circuit constitutes the first semiconductor integrated circuit.

10. The semiconductor device as claimed in claim 1, wherein
the plurality of gate signals has an identical frequency and different phases, and a summed voltage thereof is substantially constant per unit time.

11. The semiconductor device as claimed in claim 1, wherein the plurality of gate signals has an equal transition probability.

12. A semiconductor device comprising:
a first semiconductor integrated circuit having a predetermined function, the first semiconductor integrated circuit outputting a required output signal; and
a second semiconductor integrated circuit in which a plurality of MOS elements are provided, each of which is independently and sequentially switching to and from a conducting state and a non-conducting state in accordance with a plurality of gate signals each having a different timing in a time-shifting manner, the plurality of MOS elements is connected in parallel, and outputs of the plurality of MOS elements are coupled to an output or an input of the first semiconductor integrated circuit, and the plurality of MOS elements are controlled so that:
at least one of the plurality of MOS elements is in conducting state during an operation of the second semiconductor integrated circuit,
there is no situation in which all of the plurality of MOS elements are simultaneously in non-conducting state, and
a resistance value of the plurality of MOS elements becomes substantially constant regardless of values of the plurality of gate signals.

13. The semiconductor device as claimed in claim 1, wherein
each of the plurality of gate signals has a different timing in a time-shifting manner.

14. The semiconductor device as claimed in claim 1, wherein
the operation of the second semiconductor integrated circuit is a predetermined operation of the second semiconductor integrated circuit.

15. The semiconductor device as claimed in claim 12, wherein
the operation of the second semiconductor integrated circuit is a predetermined operation of the second semiconductor integrated circuit.

16. A semiconductor device for receiving a first input signal and a second input signal and output an output signal, the semiconductor device comprising:
a first semiconductor circuit for receiving the input control signal and outputting a NAND signal of the first input signal and the second input signal, the first semiconductor circuit including MOS elements connected in parallel and MOS elements connected in series;
a second semiconductor circuit for receiving the second input signal and outputting a first internal signal via a first switch and a second internal signal via a second switch for controlling the first semiconductor circuit, the second semiconductor circuit including a control circuit, wherein:
the first internal signal is applied to a gate of one of the MOS elements connected in parallel and a gate of one of the MOS elements connected in series,
the second internal signal is applied to a gate of the other one of the MOS elements connected in parallel and a gate of the other one of the MOS elements connected in series,
the control circuit of the second semiconductor circuit is configured to control the first and second switches so that every time the second input becomes high, a value of the second input is provided to the first semiconductor circuit alternately as the first internal signal or the second internal signal.

17. The semiconductor device of claim 16, wherein:
at least one of the MOS elements to which the first and second internal signals are applied is in conducting state during an operation of the semiconductor device, and
a resistance value of the MOS elements o which the first and second internal signals are applied becomes substantially constant regardless of values of the first or the second internal signals.

* * * * *